United States Patent
Ma et al.

(10) Patent No.: US 12,490,446 B2
(45) Date of Patent: Dec. 2, 2025

(54) SEMICONDUCTOR DEVICE AND METHOD OF FORMING THE SAME

(71) Applicant: United Microelectronics Corp., Hsinchu (TW)

(72) Inventors: Huan Chi Ma, Tainan (TW); Kuan-Ting Lin, New Taipei (TW); Ying Jie Huang, Changhua County (TW); Chien-Wen Yu, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 400 days.

(21) Appl. No.: 18/171,293

(22) Filed: Feb. 17, 2023

(65) Prior Publication Data
US 2024/0243185 A1    Jul. 18, 2024

(30) Foreign Application Priority Data
Jan. 16, 2023  (TW) .................. 112101679

(51) Int. Cl.
*H10D 30/01* (2025.01)
*H01L 21/225* (2006.01)
*H01L 21/311* (2006.01)
*H10D 30/47* (2025.01)
*H10D 62/17* (2025.01)
*H10D 62/85* (2025.01)
*H10D 62/854* (2025.01)

(52) U.S. Cl.
CPC ....... *H10D 30/015* (2025.01); *H01L 21/2258* (2013.01); *H01L 21/31116* (2013.01); *H10D 30/475* (2025.01); *H10D 62/221* (2025.01); *H10D 62/854* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 7,972,915 B2 | 7/2011 | Chen et al. | |
| 8,624,296 B1 * | 1/2014 | Wong | H10D 30/015 257/E21.403 |

(Continued)

OTHER PUBLICATIONS

Gaofei Tang et al., "Digital Integrated Circuits on an E-Mode GaN Power HEMT Platform", IEEE Electron device letters, vol. 38, No. 9, Sep. 2017, pp. 1282-1285.

*Primary Examiner* — Alexander G Ghyka
(74) *Attorney, Agent, or Firm* — JCIPRNET

(57) ABSTRACT

Provided is a semiconductor device including an enhancement mode (E-mode) high electron mobility transistor (HEMT). The E-mode HEMT includes a substrate, and a channel layer disposed on the substrate. A barrier structure disposed on the channel layer. A pair of source/drain (S/D) metals respectively disposed on the channel layer at opposite sides of the barrier structure. A gate metal disposed on the barrier structure between the pair of S/D metals. The channel layer has a two-dimensional electron gas (2DEG) layer close to an interface between the channel layer and the barrier structure. A fluorine ion concentration in the channel layer adjacent to the 2DEG layer is greater than that away from the 2DEG layer.

10 Claims, 3 Drawing Sheets

(56) References Cited

U.S. PATENT DOCUMENTS

| | | | |
|---|---|---|---|
| 2015/0255589 A1* | 9/2015 | Fenwick | H10D 30/475 |
| | | | 438/172 |
| 2016/0284828 A1* | 9/2016 | Shimizu | H10D 64/691 |
| 2019/0067440 A1* | 2/2019 | Shrivastava | H01L 21/02178 |
| 2022/0093780 A1* | 3/2022 | Huang | H10D 62/8503 |
| 2022/0181159 A1* | 6/2022 | Posthuma | H01L 21/32135 |
| 2023/0246070 A1* | 8/2023 | Yoshida | H10D 30/015 |
| | | | 257/213 |

* cited by examiner

SEMICONDUCTOR DEVICE AND METHOD OF FORMING THE SAME

CROSS-REFERENCE TO RELATED APPLICATION

This application claims the priority benefit of Taiwan application Ser. No. 112101679, filed on Jan. 16, 2023. The entirety of the above-mentioned patent application is hereby incorporated by reference herein and made a part of this specification.

BACKGROUND OF THE INVENTION

Field of the Invention

The present invention relates to a semiconductor device and a method of forming the same, and more particularly to a high electron mobility transistor (HEMT) device and a method of forming the same.

Description of Related Art

In semiconductor technology, III-V semiconductor compounds may be used to form various integrated circuit devices, such as high-power field effect transistors, high-frequency transistors or high-electron mobility transistors (HEMT). HEMT is a type of field effect transistor having a two-dimensional electron gas (2DEG) layer that is adjacent to a junction between two materials with different energy gaps (i.e., a heterojunction). Since HEMT does not use the doped region as the carrier channel of the transistor, but uses the 2DEG layer as the carrier channel of the transistor, compared with the conventional metal-oxide-semiconductor field effect transistor (MOSFET), HEMT has many attractive characteristics, such as the ability to high electron mobility and the ability to transmit signals at high frequencies.

HEMT may include an enhancement mode (E-mode) HEMT device and a depletion type (D-mode) HEMT device. The D-mode HEMT device may also be referred to as the normally-on device. That is, the said device is at on-stage when the gate voltage is zero, and the negative voltage needs to be applied to turn off the device. On the other hand, the E-mode HEMT device may also be referred to as the normally-off device. That is, the said device is at off-stage when the gate voltage is zero, and the positive voltage needs to be applied to turn on the device.

SUMMARY OF THE INVENTION

The present invention provides a semiconductor device including an enhancement mode (E-mode) high electron mobility transistor (HEMT). The E-mode HEMT includes a substrate; a channel layer disposed on the substrate; a barrier structure disposed on the channel layer; a pair of source/drain (S/D) metals respectively disposed on the channel layer at opposite sides of the barrier structure; and a gate metal disposed on the barrier structure between the pair of S/D metals. The channel layer has a two-dimensional electron gas (2DEG) layer close to an interface between the channel layer and the barrier structure. A fluorine ion concentration in the channel layer adjacent to the 2DEG layer is greater than that away from the 2DEG layer.

In an embodiment of the present invention, the barrier structure includes a first barrier layer and a second barrier layer overlying the first barrier layer, and the first and second barrier layers have different materials.

In an embodiment of the present invention, a fluorine ion concentration in the second barrier layer gradually decreases from a top surface of the second barrier layer toward a bottom surface of the second barrier layer.

In an embodiment of the present invention, the semiconductor device further includes a cap layer disposed between the barrier structure and the gate metal, wherein a thickness of the cap layer is less than or equal to 2 nm.

In an embodiment of the present invention, the semiconductor device further includes a buffer layer disposed between the substrate and the channel layer.

The present invention provides a semiconductor device including a depletion mode (D-mode) high electron mobility transistor (HEMT). The D-mode HEMT includes a substrate; a channel layer disposed on the substrate; a barrier structure disposed on the channel layer; a pair of source/drain (S/D) metals respectively disposed on the channel layer at opposite sides of the barrier structure; and a gate metal disposed on the barrier structure between the pair of S/D metals. The channel layer has a two-dimensional electron gas (2DEG) layer close to an interface between the channel layer and the barrier structure. A fluorine ion concentration in the channel layer adjacent to the 2DEG layer is less than that away from the 2DEG layer.

In an embodiment of the present invention, the barrier structure includes a first barrier layer and a second barrier layer overlying the first barrier layer, and the first and second barrier layers have different materials.

In an embodiment of the present invention, a fluorine ion concentration in the second barrier layer gradually decreases from a top surface of the second barrier layer toward a bottom surface of the second barrier layer.

In an embodiment of the present invention, the semiconductor device further includes a cap layer disposed between the barrier structure and the gate metal, wherein a thickness of the cap layer is less than or equal to 2 nm.

In an embodiment of the present invention, the semiconductor device further includes a buffer layer disposed between the substrate and the channel layer.

The present invention provides a method of forming a semiconductor device including: forming a channel layer on a substrate; forming a barrier structure on the channel layer, wherein the channel layer has a two-dimensional electron gas (2DEG) layer close to an interface between the channel layer and the barrier structure; respectively forming a pair of source/drain (S/D) metals on the channel layer at opposite sides of the barrier structure; forming a dielectric layer and a mask pattern on the barrier structure; performing an etching process on the dielectric layer through the mask pattern to form a gate opening in the dielectric layer and implant fluorine ions used in the etching process into the barrier structure through the gate opening; and forming a gate metal in the gate opening.

In an embodiment of the present invention, the method further includes: forming a dielectric cap layer to cover the gate metal and the pair of S/D metals; and performing a thermal annealing process to diffuse the fluorine ions in the barrier structure into the channel layer.

In an embodiment of the present invention, a temperature of the thermal annealing process is between 250° C. and 500° C.

In an embodiment of the present invention, when the temperature of the thermal annealing process is greater than or equal to 300° C., a fluorine ion concentration in the channel layer adjacent to the 2DEG layer is less than that away from the 2DEG layer, so that the semiconductor device forms a depletion mode (D-mode) high electron mobility transistor (HEMT).

In an embodiment of the present invention, when the temperature of the thermal annealing process is less than 300° C., a fluorine ion concentration in the channel layer adjacent to the 2DEG layer is greater than that away from the 2DEG layer, so that the semiconductor device forms an enhancement mode (E-mode) HEMT.

In an embodiment of the present invention, after performing the thermal annealing process, the method further comprises applying a set voltage to the gate metal to adjust a threshold voltage of the semiconductor device.

In an embodiment of the present invention, the set voltage is between −10V and 0V, and an absolute value of the threshold voltage of the semiconductor device increases as an absolute value of the set voltage increases.

In an embodiment of the present invention, the method further includes: forming a semiconductor cap layer between the barrier structure and the gate metal, wherein a thickness of the semiconductor cap layer is less than or equal to 2 nm.

In an embodiment of the present invention, the barrier structure comprises a first barrier layer and a second barrier layer overlying the first barrier layer, and the first and second barrier layers have different materials.

In an embodiment of the present invention, a fluorine ion concentration in the second barrier layer gradually decreases from a top surface of the second barrier layer toward a bottom surface of the second barrier layer.

In summary, in the embodiment of the present invention, fluorine ions are unintentionally implanted into the barrier layer (e.g., AlGaN layer) through the fluorine-containing etchant used in the etching process for defining the gate metal, and the fluorine ions are even diffused into the channel layer (e.g., GaN layer) through a thermal annealing process to achieve multi threshold voltage. In addition, the embodiment of the present invention may optionally diffuse the fluorine ions away from the 2DEG layer through gate voltage setting (Vg setting), so as to further adjust the threshold voltage (Vt) of the device. Further, the embodiment of the present invention may also change the process temperature of the thermal annealing process and the thickness of the semiconductor cap layer to adjust the threshold voltage of the device. Therefore, the embodiment of the present invention can adjust the process conditions or set the gate voltage to form the E-mode HEMT device or the D-mode HEMT device.

To provide a further understanding of the aforementioned and other features and advantages of the disclosure, exemplary embodiments, together with the reference drawings, are described in detail below.

DESCRIPTION OF THE EMBODIMENTS

Figure 1:
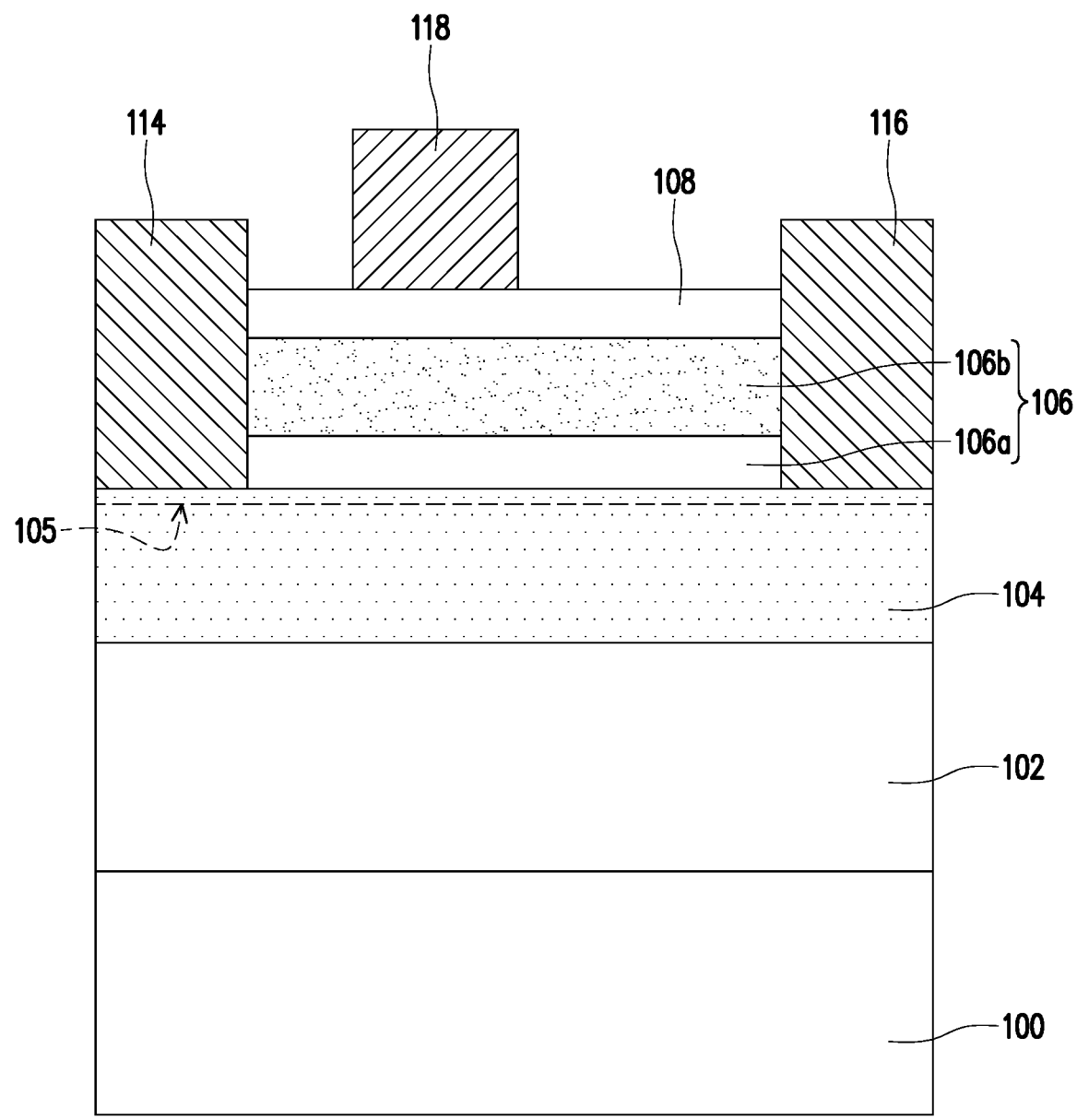
FIG. 1 is a schematic cross-sectional view of a semiconductor device according to an embodiment of the present invention.

The invention will be described in detail with reference to the drawings of the embodiments. However, the invention may also be implemented in various different forms and shall not be limited to the embodiments described herein. Thicknesses of layers and regions in the drawings are exaggerated for clarity. The same or similar numerals represent the same or similar components, which will not be repeatedly described in subsequent paragraphs.

FIG. 1 is a schematic cross-sectional view of a semiconductor device according to an embodiment of the present invention. The semiconductor device in the following embodiment illustrated by using a high electron mobility transistor (HEMT) device as an example, but the present invention is not limited thereto.

Referring to FIG. 1, an embodiment of the present invention provides a semiconductor device includes: a substrate 100, a buffer layer 102, a channel layer 104, a barrier structure 106, a pair of source/drain (S/D) metals 114, 116, and a gate metal 118. In one embodiment, the substrate 100 includes a bulk silicon substrate, a silicon carbide (SiC) substrate, a sapphire substrate, a silicon on insulator (SOI) substrate, or a germanium on insulator (GOI) substrate, but the present invention is not limited thereto.

In detail, the buffer layer 102 may be disposed on the substrate 100 to reduce the stress and/or the lattice mismatch between the substrate 100 and the overlying channel layer 104. In one embodiment, the material of the buffer layer 102 includes graded aluminum gallium nitride ($Al_xGa_{(1-x)}N$), where the value of X decreases in a continuous or stepwise manner along the direction from the substrate 100 to the channel layer 104. In one embodiment, the channel layer 104 may be formed by a molecular-beam epitaxy (MBE) process, a metal organic chemical vapor deposition (MOCVD) process, a chemical vapor deposition (CVD) process, a hydride vapor phase epitaxy (HVPE) process, or the like.

The channel layer 104 may be disposed on the buffer layer 102, so that the buffer layer 102 is sandwiched between the substrate 100 and the channel layer 104. In one embodiment, a material of the channel layer 104 includes III-V semiconductor materials. For example, the channel layer 104 may be a gallium nitride (GaN) epitaxial layer. In one embodiment, the channel layer 104 may be formed by a MBE process, a MOCVD process, a CVD process, a HVPE process, or the like.

The barrier structure 106 may be disposed on the channel layer 104. In one embodiment, the barrier structure 106 includes one or more III-V semiconductor layers. For example, the barrier structure 106 may include a first barrier layer 106a and a second barrier layer 106b overlying the first barrier layer 106a, and the first barrier layer 106a and the second barrier layer 106b may have different materials. In the present embodiment, the first barrier layer 106a may be an aluminum nitride (AlN) layer, and the second barrier layer 106b may be an aluminum gallium nitride (AlGaN) layer. A thickness of the first barrier layer 106a may be less than a thickness of the second barrier layer 106b. In one embodiment, the composition of the barrier structure 106 may be different from the composition of the channel layer 104. For example, the channel layer 104 may be an undoped GaN layer, and the first barrier layer 106a of the barrier structure 106 close to the channel layer 104 may be an N-type AlN layer. Since there is a discontinuous energy gap between the channel layer 104 and the barrier structure 106, electrons will be gathered due to the piezoelectric effect at the heterojunction between the channel layer 104 and the barrier structure 106, thereby generating a thin layer of high electron mobility, namely a two-dimensional electron gas (2DEG) layer 105. That is, the channel layer 104 may have the 2DEG layer 105 close to the interface between the channel layer 104 and the barrier structure 106.

It should be noted that, in the present embodiment, the barrier structure 106 may be non-intentionally implanted with fluorine ions by using a fluorine-containing etchant used in the etching process of defining the gate metal 118 (described in detail in the following paragraphs). In this case, the barrier structure 106 may have fluorine ions, and the fluorine ions may be doped into the second barrier layer 106*b* or diffused into the channel layer 104. In one embodiment, a fluorine ion concentration in the second barrier layer 106*b* gradually decreases from the top surface of the second barrier layer 106*b* toward the bottom surface of the second barrier layer 106*b*. For example, the fluorine ion concentration at the top surface of the second barrier layer 106*b* may be greater than $1\times10^{20}$ atoms/cm$^3$, and the fluorine ion concentration at the bottom surface of the second barrier layer 106*b* may be less than $1\times10^{19}$ atoms/cm$^3$. In the present embodiment, the fluorine ion concentration in the channel layer 104 adjacent to the 2DEG layer 105 may be greater than that far away from the 2DEG layer 105. Since fluoride ions have strong electro-negativity, fluoride ions can provide fixed negative charges to effectively deplete electrons in the 2DEG layer 105. That is, HEMT devices with fluorine ions may be referred to as the enhancement mode (E-mode) HEMT devices.

On the other hand, the present embodiment may change the distance between the fluorine ions and the 2DEG layer 105 through gate voltage setting (Vg setting), so as to further adjust the threshold voltage (Vt) of the semiconductor device. Specifically, when a large negative gate setting voltage is applied, fluorine ions may be diffused into the channel layer 104 and away from the 2DEG layer 105. In this case, the fluorine ion concentration in the channel layer 104 adjacent to the 2DEG layer 105 may be less than that far away from the 2DEG layer 105, so that the E-mode HEMT device is transformed into a D-mode HEMT device, thereby achieving the purpose of multi threshold voltage. That is, in the present embodiment, different gate setting voltages may be used to set the same device structure to a HEMT device with different threshold voltages, such as setting as an E-mode HEMT device or a D-mode HEMT device. Therefore, the present invention can realize the integration of the E-mode HEMT device and the D-mode HEMT device in the same chip without changing the process steps. In one embodiment, the gate setting voltage is between −10V and 0V, and an absolute value of the threshold voltage of the HEMT device increases as an absolute value of the gate setting voltage increases. For example, when the gate setting voltage is changed from −1V to −4V, the threshold voltage may be changed from about −2.2V to about −3.1V, and the saturation current (Id) may be changed from about 1.15 mA to about 1.78 mA.

As shown in FIG. 1, a pair of S/D metals 114, 116 may be respectively disposed on the channel layer 104 at opposite sides of the barrier structure 106, and the gate metal 118 may be disposed on the barrier structure 106 between the S/D metals 114, 116. Specifically, the S/D metals 114, 116 and the gate metal 118 may be laterally separated from each other. In one embodiment, the S/D metals 114, 116 and the gate metal 118 both include metal materials. For example, the S/D metals 114, 116 and the gate metal 118 may each include metal materials such as gold, silver, platinum, titanium, aluminum, tungsten, palladium, or a combination thereof. In the present embodiment, the gate metal 118 may be made of a Schottky metal; and the S/D metals 114, 116 may be made of an ohmic contact metal. In some embodiments, the S/D metals 114, 116 and the gate metal 118 may be formed by using an electroplating process, a sputtering process, a resistance heating evaporation process, an electron beam evaporation process, a physical vapor deposition (PVD) process, a chemical vapor deposition (CVD) process, or the like.

In addition, in the embodiment of the present invention, the semiconductor device may optionally have a cap layer 108. The cap layer 108 may be disposed between the barrier structure 106 and the gate metal 118. In some embodiments, the cap layer 108 (also referred to as semiconductor cap layer) may be a GaN layer, and may be formed by a MBE process, a MOCVD process, a CVD process, a HVPE process, or the like. In the present embodiment, a thickness of the cap layer 108 is less than or equal to 2 nm.

FIG. 2 to FIG. 5 are schematic cross-sectional views of a manufacturing process of a semiconductor device according to an embodiment of the present invention. For the sake of simplicity, the buffer layer 102, the channel layer 104, the barrier layer 106 and the cap layer 108 illustrated in FIG. 1 are replaced by an epitaxial layer structure 107 in the following figures.

Figure 2:
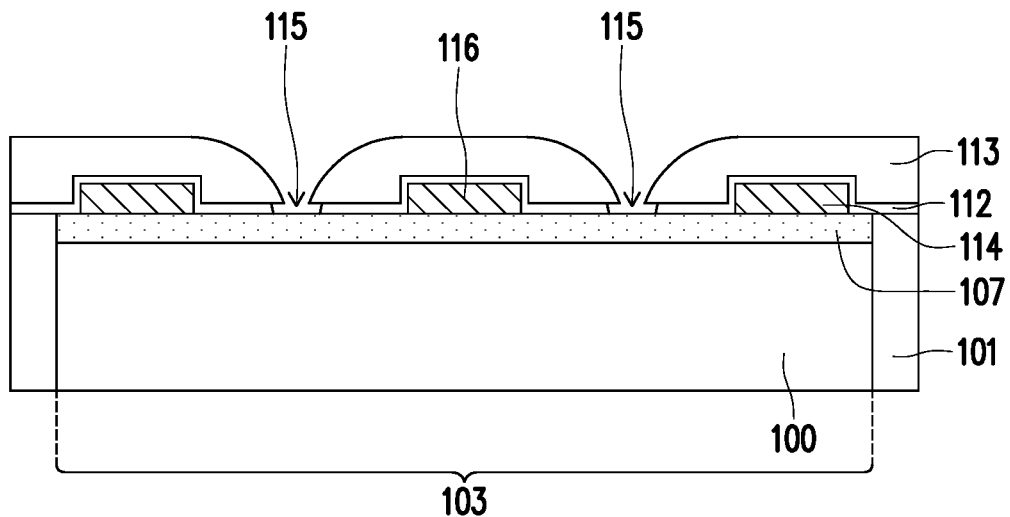
FIG. 2 to FIG. 5 are schematic cross-sectional views of a manufacturing process of a semiconductor device according to an embodiment of the present invention.

Referring to FIG. 2, after forming the S/D metals 114, 116, a first dielectric layer 112 may be formed to conformally cover the S/D metals 114, 116. In one embodiment, a material of the first dielectric layer 112 includes silicon oxide, silicon nitride, silicon oxynitride or a combination thereof, and may be formed by a CVD process. Next, a first mask pattern 113 is formed on the first dielectric layer 112. In one embodiment, a material of the first mask pattern 113 includes propylene glycol methyl ether acetate (PMA), polymethyl methacrylate (PMMA) or a combination thereof, and may be formed by a CVD process. Then, an etching process is performed on the first dielectric layer 112 through the first mask pattern 113 to form a gate opening 115. In one embodiment, the gate opening 115 penetrates through the first dielectric layer 112 to expose the top surface of the barrier structure (e.g., the barrier structure 106 shown in FIG. 1). In another embodiment, the gate opening 115 penetrates through the first dielectric layer 112 to expose the top surface of the cap layer 108 (as shown in FIG. 1).

In one embodiment, the said etching process includes a dry etching process, such as a reactive ion etching (RIE) process. It should be noted that the etching process includes using a fluorine-containing etchant, such as $CF_4$, $C_2F_6$, $SF_6$, or a combination thereof. Therefore, during the etching process, fluorine ions in the fluorine-containing etchant may be implanted into the barrier structure 106 through the gate opening 115, especially in the second barrier layer 106*b* (as shown in FIG. 1). Therefore, the fluorine ion concentration in the second barrier layer 106*b* may gradually decrease from the top surface of the second barrier layer 106*b* toward the bottom surface of the second barrier layer 106*b*. For example, the fluorine ion concentration at the top surface of the second barrier layer 106*b* may be greater than $1\times10^{20}$ atoms/cm$^3$, and the fluorine ion concentration at the bottom surface of the second barrier layer 106*b* may be less than $1\times10^{19}$ atoms/cm$^3$. However, the present invention is not limited thereto, in other embodiments, the fluorine ion concentration in the second barrier layer 106*b* will also change with different etching tools used in the etching process. That is, as long as the fluorine ions are not intentionally implanted into the barrier structure in the step of defining the gate opening, it is within the protection scope of the present invention. In addition, the thickness of the cap layer 108 (as shown in FIG. 1) may also be used to adjust the concentration of fluorine ions doped into the barrier structure 106. For example, when the thickness of the cap layer 108 is thicker, the barrier structure 106 has a lower fluorine ion concentration. On the contrary, when the thickness of the cap layer 108 is thinner or even does not have the cap layer 108, the barrier structure 106 has a higher fluorine ion concentration.

In addition, as shown in FIG. 2, the semiconductor device of the present embodiment further includes an isolation structure 101 embedded in the epitaxial structure 107 and the substrate 100 to define the active area 103. In one embodiment, the isolation structure 101 may be a shallow trench isolation (STI) structure formed of silicon oxide.

Figure 3:
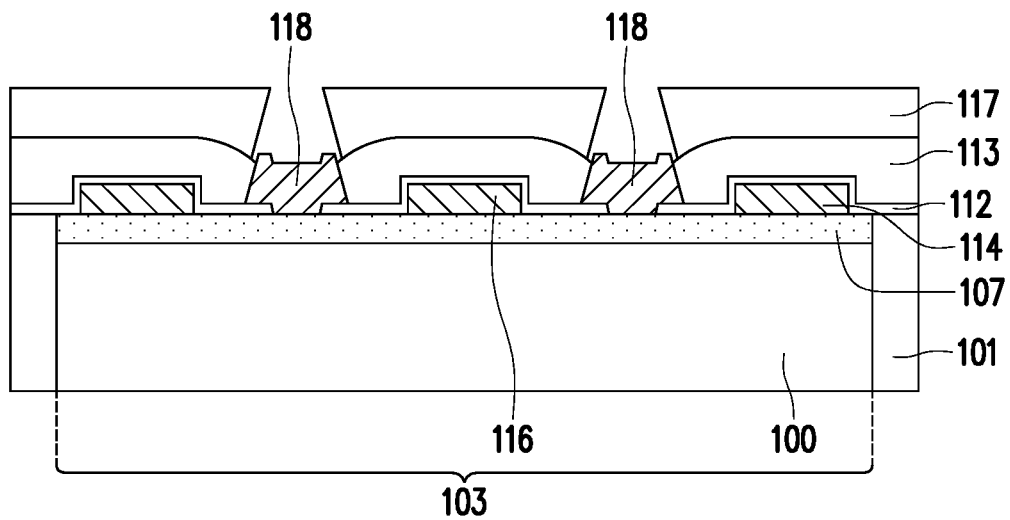

Referring to FIG. 2 and FIG. 3, the gate metal 108 is formed in the gate opening 115. Specifically, a second mask pattern 117 is formed on the first mask pattern 113, where the second mask pattern 117 may have an opening corresponding to the gate opening 115. In one embodiment, a material of the second mask pattern 117 includes propylene glycol methyl ether acetate (PMA), polymethyl methacrylate (PMMA), or a combination thereof, and may be formed by a CVD process. Then, a metal material is formed by an electroplating process, a sputtering process, a resistance heating evaporation process, an electron beam evaporation process, a PVD process, a CVD process, or the like to fill into the gate opening 115, thereby forming the gate metal 118. In the present embodiment, the gate metal 118 may be a composite structure composed of a nickel layer and a gold layer.

Figure 4:
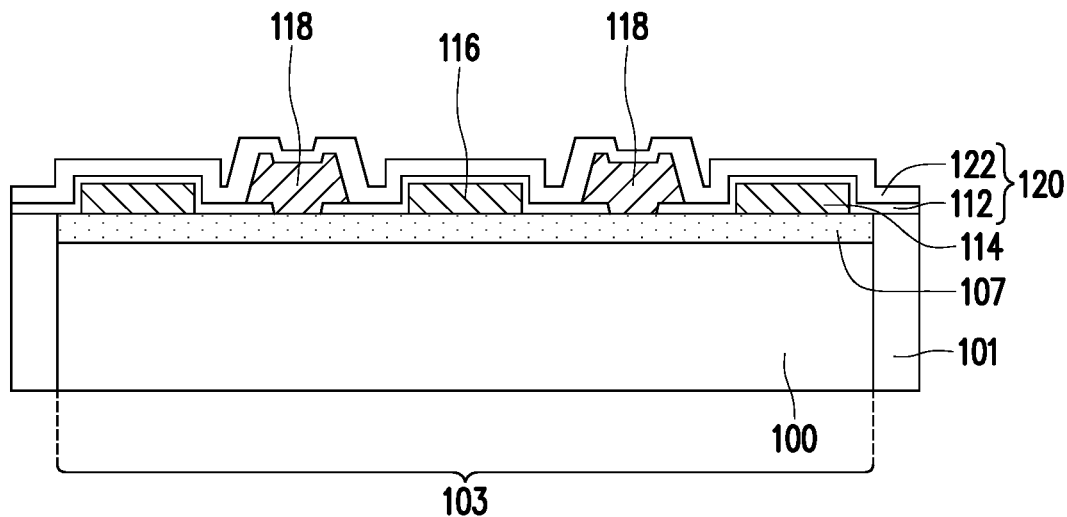

Referring to FIG. 3 and FIG. 4, after removing the first mask pattern 113 and the second mask pattern 117, a second dielectric layer 122 is formed on the first dielectric layer 112 to form a dielectric material 120. The dielectric material 120 may wrap the S/D metals 114, 116 and the gate metal 118. In one embodiment, a material of the second dielectric layer 122 includes silicon oxide, silicon nitride, silicon oxynitride or a combination thereof, and may be formed by a CVD process. The first dielectric layer 112 and the second dielectric layer 122 may include the same dielectric material, such as silicon nitride. In addition, after forming the second dielectric layer 122 (also referred to as dielectric capping layer), a thermal annealing process may be performed to diffuse the fluorine ions in the barrier structure 106 into the channel layer 104 (as shown in FIG. 1). In one embodiment, a temperature of the thermal annealing process is between 250° C. and 500° C.

It should be noted that when the temperature of the thermal annealing process is greater than or equal to 300° C., the fluorine ions may be diffused into the channel layer and away from the 2DEG layer. In this case, the fluorine ion concentration in the channel layer adjacent to the 2DEG layer is less than that away from the 2DEG layer, so that the semiconductor device is formed as a D-mode HEMT device. On the contrary, when the temperature of the thermal annealing process is less than 300° C., the fluorine ion concentration in the channel layer adjacent to the 2DEG layer is greater than that far away from the 2DEG layer, so that the semiconductor device is formed as an E-mode HEMT device. That is, the present embodiment may adjust the temperature of the thermal annealing process, so that the same device structure may be changed into a HEMT device with different threshold voltages, such as an E-mode HEMT device or a D-mode HEMT device. In some embodiments, the subsequent gate voltage setting (Vg setting) may be omitted by only adjusting the temperature of the thermal annealing process.

Figure 5:
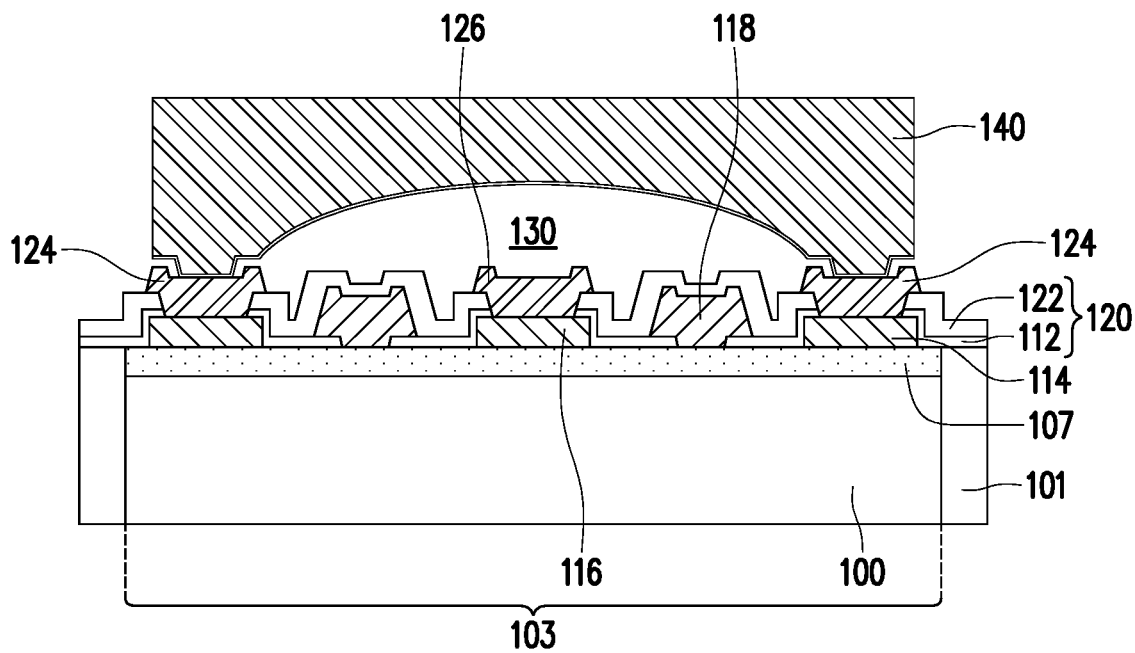

Referring to FIG. 5, first metal layers 124, 126 are formed on the S/D metals 114, 116. Specifically, the first metal layer 124 may be disposed on the S/D metal 114 and be in contact with the S/D metal 114 (e.g., the source metal). The first metal layer 126 may be disposed on the S/D metal 116 and be in contact with the S/D metal 116 (e.g., the drain metal). In one embodiment, both the first metal layers 124 and 126 include metal materials. For example, the first metal layers 124 and 126 may each include metal materials such as gold, silver, platinum, titanium, aluminum, tungsten, palladium, or a combination thereof. In some embodiments, the first metal layers 124 and 126 may be formed by forming metal materials by using an electroplating process, a sputtering process, a resistance heating evaporation process, an electron beam evaporation process, a physical vapor deposition (PVD) process, a chemical vapor deposition (CVD) process, or the like, and then patterning the metal materials. In the present embodiment, the first metal layers 124 and 126 may be regarded as the metal one (M1).

Next, a second metal layer 140 is formed on the first metal layers 124 and 126, thereby accomplishing the semiconductor device of the present embodiment. Specifically, the second metal layer 140 may be disposed on the first metal layers 124, 126 and in contact with the first metal layers 124, 126. In one embodiment, the second metal layer 140 includes a metal material. For example, the second metal layer 140 may include the metal material such as gold, silver, platinum, titanium, aluminum, tungsten, palladium, or a combination thereof. In some embodiments, the second metal layer 140 may be formed by forming metal materials by using an electroplating process, a sputtering process, a resistance heating evaporation process, an electron beam evaporation process, a physical vapor deposition (PVD) process, a chemical vapor deposition (CVD) process, or the like, and then patterning the metal materials. In the present embodiment, the second metal layer 140 may be regarded as the metal two (M2). As shown in FIG. 5, one end of the second metal layer 140 may be connected to one first metal layer 124, and the other end of the second metal layer 140 may be connected to another first metal layer 124 to form an air bridge 130. In the present embodiment, the air bridge 130 is filled with the air with a dielectric constant close to 1, which can effectively reduce the capacitance of the interconnect structure and reduce the resistance-capacitance (RC) delay, thereby improving the operating efficiency of the device. Therefore, the semiconductor device of the present embodiment may be applied to radio frequency (RF) devices.

Further, after accomplishing the semiconductor device, the gate voltage setting (Vg setting) may also be performed to change the distance between the fluorine ions and the 2DEG layer 105 to further adjust the threshold voltage (Vt) of the semiconductor device. The detailed gate voltage setting steps have been described in the above paragraphs, and will not be repeated here.

In summary, in the embodiment of the present invention, fluorine ions are unintentionally implanted into the barrier layer (e.g., AlGaN layer) through the fluorine-containing etchant used in the etching process for defining the gate metal, and the fluorine ions are even diffused into the channel layer (e.g., GaN layer) through a thermal annealing process to achieve multi threshold voltage. In addition, the embodiment of the present invention may optionally diffuse the fluorine ions away from the 2DEG layer through gate voltage setting (Vg setting), so as to further adjust the threshold voltage (Vt) of the device. Further, the embodiment of the present invention may also change the process temperature of the thermal annealing process and the thickness of the semiconductor cap layer to adjust the threshold voltage of the device. Therefore, the embodiment of the present invention can adjust the process conditions or set the gate voltage to form the E-mode HEMT device or the D-mode HEMT device.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A semiconductor device comprising an enhancement mode (E-mode) high electron mobility transistor (HEMT), wherein the E-mode HEMT comprises:
   a substrate;
   a channel layer disposed on the substrate;
   a barrier structure disposed on the channel layer;
   a pair of source/drain (S/D) metals respectively disposed on the channel layer at opposite sides of the barrier structure; and
   a gate metal disposed on the barrier structure between the pair of S/D metals, wherein the channel layer has a two-dimensional electron gas (2DEG) layer close to an interface between the channel layer and the barrier structure, and a fluorine ion concentration in the channel layer adjacent to the 2DEG layer is greater than that away from the 2DEG layer.

2. The semiconductor device of claim 1, wherein the barrier structure comprises a first barrier layer and a second barrier layer overlying the first barrier layer, and the first and second barrier layers have different materials.

3. The semiconductor device of claim 2, wherein a fluorine ion concentration in the second barrier layer gradually decreases from a top surface of the second barrier layer toward a bottom surface of the second barrier layer.

4. The semiconductor device of claim 1, further comprising a cap layer disposed between the barrier structure and the gate metal, wherein a thickness of the cap layer is less than or equal to 2 nm.

5. The semiconductor device of claim 1, further comprising: a buffer layer disposed between the substrate and the channel layer.

6. A semiconductor device comprising a depletion mode (D-mode) high electron mobility transistor (HEMT), wherein the D-mode HEMT comprises:
   a substrate;
   a channel layer disposed on the substrate;
   a barrier structure disposed on the channel layer;
   a pair of source/drain (S/D) metals respectively disposed on the channel layer at opposite sides of the barrier structure; and
   a gate metal disposed on the barrier structure between the pair of S/D metals, wherein the channel layer has a two-dimensional electron gas (2DEG) layer close to an interface between the channel layer and the barrier structure, and a fluorine ion concentration in the channel layer adjacent to the 2DEG layer is less than that away from the 2DEG layer.

7. The semiconductor device of claim 6, wherein the barrier structure comprises a first barrier layer and a second barrier layer overlying the first barrier layer, and the first and second barrier layers have different materials.

8. The semiconductor device of claim 7, wherein a fluorine ion concentration in the second barrier layer gradually decreases from a top surface of the second barrier layer toward a bottom surface of the second barrier layer.

9. The semiconductor device of claim 6, further comprising a cap layer disposed between the barrier structure and the gate metal, wherein a thickness of the cap layer is less than or equal to 2 nm.

10. The semiconductor device of claim 6, further comprising: a buffer layer disposed between the substrate and the channel layer.

* * * * *